(12) United States Patent
Sun et al.

(10) Patent No.: US 11,557,557 B2
(45) Date of Patent: Jan. 17, 2023

(54) FLIP-CHIP FLEXIBLE UNDER BUMP METALLIZATION SIZE

(71) Applicant: QUALCOMM Incorporated, San Diego, CA (US)

(72) Inventors: Yangyang Sun, San Diego, CA (US); Dongming He, San Diego, CA (US); Lily Zhao, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 70 days.

(21) Appl. No.: 16/917,295

(22) Filed: Jun. 30, 2020

(65) Prior Publication Data
US 2021/0407939 A1 Dec. 30, 2021

(51) Int. Cl.
*H01L 23/00* (2006.01)

(52) U.S. Cl.
CPC .............. *H01L 24/06* (2013.01); *H01L 24/03* (2013.01); *H01L 24/05* (2013.01); *H01L 24/13* (2013.01); *H01L 2224/0346* (2013.01); *H01L 2224/0401* (2013.01); *H01L 2224/05015* (2013.01); *H01L 2224/05147* (2013.01); *H01L 2224/0603* (2013.01); *H01L 2224/06163* (2013.01); *H01L 2224/13026* (2013.01); *H01L 2224/13211* (2013.01); *H01L 2224/13239* (2013.01); *H01L 2924/014* (2013.01)

(58) Field of Classification Search
CPC combination set(s) only.
See application file for complete search history.

(56) References Cited

U.S. PATENT DOCUMENTS

| 6,107,685 A * | 8/2000 | Nishiyama | H01L 24/12 257/737 |
| 2008/0116567 A1* | 5/2008 | Amin | H05K 1/0204 257/712 |
| 2011/0151627 A1* | 6/2011 | Graf | H01L 24/81 438/121 |
| 2011/0248398 A1 | 10/2011 | Parvarandeh et al. | |
| 2014/0042615 A1 | 2/2014 | Huang et al. | |
| 2014/0264928 A1* | 9/2014 | Lin | H01L 21/486 257/774 |
| 2017/0170136 A1 | 6/2017 | Seo et al. | |

(Continued)

FOREIGN PATENT DOCUMENTS

| JP | 3583862 B2 | 11/2004 | |
| WO | WO-2019132970 A1 * | 7/2019 | ......... H01L 23/5385 |

OTHER PUBLICATIONS

International Search Report and Written Opinion—PCT/US2021/034862—ISA/EPO—dated Oct. 14, 2021.

(Continued)

*Primary Examiner* — Douglas W Owens
(74) *Attorney, Agent, or Firm* — Muncy, Geissler, Olds & Lowe, P.C.

(57) ABSTRACT

Disclosed is a flip-chip device. The flip-chip device includes a die having a plurality of under bump metallizations (UBMs); and a package substrate having a plurality of bond pads. The plurality of UBMs include a first set of UBMs having a first size and a first minimum pitch and a second set of UBMs having a second size and a second minimum pitch. The first set of UBMs and the second set of UBMs are each electrically coupled to the package substrate by a bond-on-pad connection.

24 Claims, 13 Drawing Sheets

(56) References Cited

U.S. PATENT DOCUMENTS

2018/0184524 A1* 6/2018 Xiong ............... H01L 23/49822
2020/0098692 A1* 3/2020 Liff .......................... H01L 24/16
2021/0233892 A1* 7/2021 Sikka .................. H01L 23/3157

OTHER PUBLICATIONS

Zhang X., et al., "Heterogeneous 2.5D Integration on ThroughSilicon Interposer", Applied Physics Reviews, vol. 2, No. 2, Jun. 1, 2015(Jun. 1, 2015), p. 021308, XP055776606, 60 Pages, DOI: 10.1063/1.4921463,Section C. Bumping, Paragraphs 1-4; Table II.

* cited by examiner

| UBM (um) | Web (SR Web) | SRR | S | SRO | Pad | A Min. Pitch Cal. from Cu Pad + S | B Min. Pitch Cal. from SR SRO + Web | P* (Min. Bump to Bump Pitch) Larger Number of A or B | Note |
|---|---|---|---|---|---|---|---|---|---|
| | | | | UBM+25 | SRO+ 2*SRR | | | | |
| | Substrate Design Rule | | | | | | | | |
| 75 | 40 | 12.5 | 20 | 100 | 125 | 145 | 140 | 145 | 75um UBM Min. Pitch 145 um. |
| 60 | 40 | 12.5 | 20 | 85 | 110 | 130 | 125 | 130 | 60um UBM Min. Pitch 130 um. |

* No trace between (i)

(ii)

(iii)

(iv)

(v)

(vi)

FLIP-CHIP FLEXIBLE UNDER BUMP METALLIZATION SIZE

FIELD OF DISCLOSURE

This disclosure relates generally to package devices, and more specifically, but not exclusively, to flexible under bump metallization (UBM) design for flip-chip devices and fabrication techniques thereof.

BACKGROUND

Integrated circuit technology has achieved great strides in advancing computing power through miniaturization of active components. The flip-chip devices can be found in many electronic devices, including processors, servers, radio frequency (RF) integrated circuits, etc. Flip-chip packaging technology becomes cost-effective in high pin count devices. The flip-chip bonding conventionally uses solder-on-pad (SOP) technology for flip-chip substrates. There are many solutions for the SOP technology and each has its advantages and disadvantages.

Additionally, conventional flip-chip design uses either a uniform bump size across the whole chip or in some designs may define the different bump size based on the die location in digital die designs. Recently more radio frequency (RF) products have moved to flip-chip designs. However, this transition of RF technology has made it difficult for conventional flip-chip designs to meet the bump density requirements for the flip-chip because the large number of bump keep-out-zones (KOZs).

Accordingly, there is a need for systems, apparatus, and methods that overcome the deficiencies of conventional flip-chip processes including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In accordance with the various aspects disclosed herein, at least one aspect includes, a flip-chip device including: a die having a plurality of under bump metallizations (UBMs); and a package substrate having a plurality of bond pads; where the plurality of UBMs include a first set of UBMs having a first size and a first minimum pitch and a second set of UBMs having a second size and a second minimum pitch; and where the first set of UBMs and the second set of UBMs are each electrically coupled to the package substrate by a bond-on-pad connection.

In accordance with the various aspects disclosed herein, at least one aspect includes, a method for fabricating a flip-chip device, the method including: providing a die having a plurality of under bump metallizations (UBMs); providing a package substrate having a plurality of bond pads; and forming a first set of UBMs of the plurality of UBMs having a first size and a first minimum pitch; forming a second set of UBMs of the plurality of UBMs having second size and a second minimum pitch; and electrically coupling each of the first set of UBMs and the second set of UBMs to the package substrate by a bond-on-pad connection. Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1:
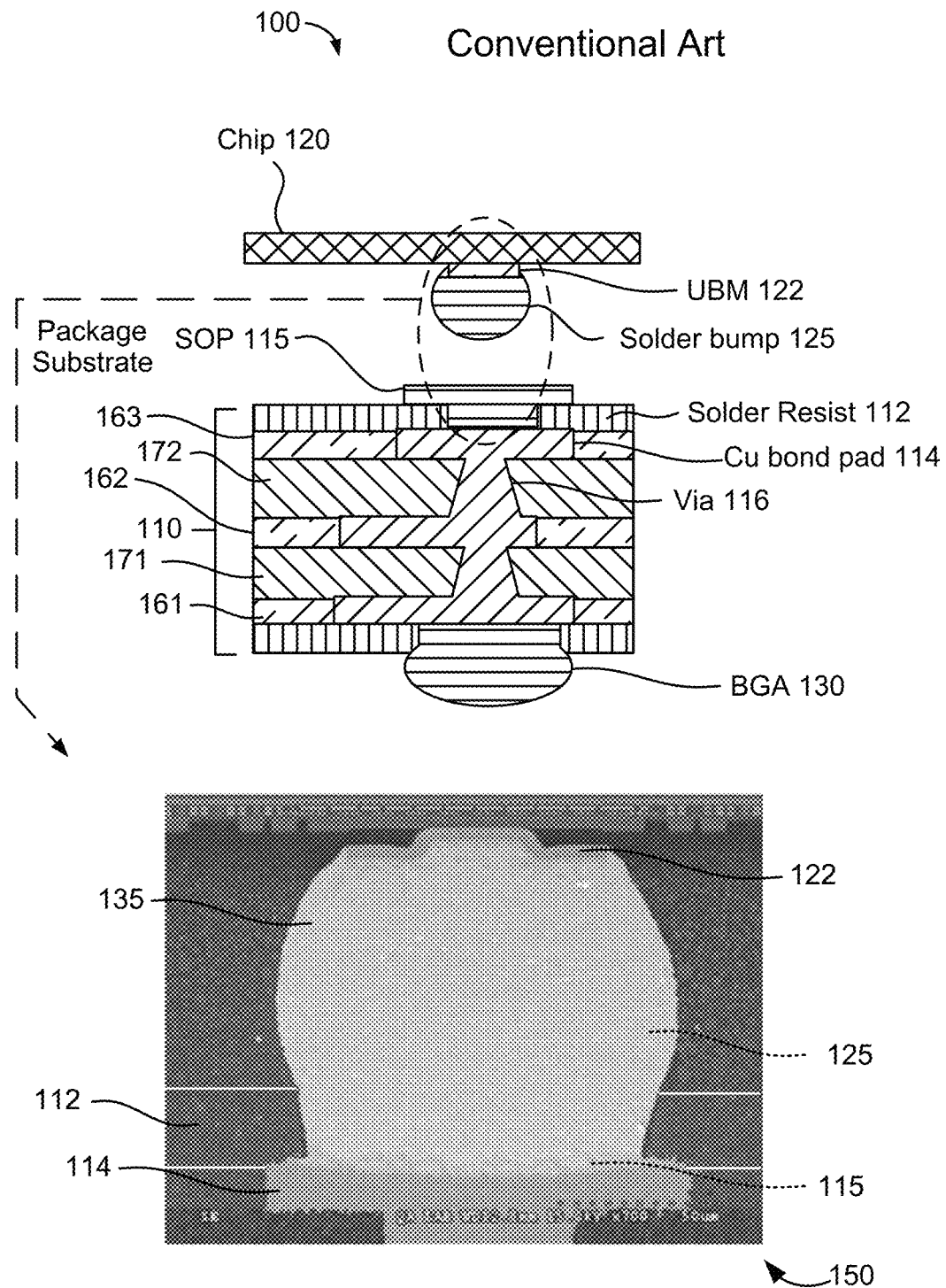
FIG. 1 illustrates a partial cross-sectional view of a conventional interconnection of a flip-chip device.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific aspects. Alternate aspects may be devised without departing from the scope of the teachings herein. Additionally, well-known elements of the illustrative aspects herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary aspects. In such instances, internal details of the known, conventional component structures and/or portions of operations may be omitted to help avoid potential obfuscation of the concepts illustrated in the illustrative aspects disclosed herein.

The terminology used herein is for the purpose of describing particular aspects only and is not intended to be limiting As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

FIG. 1 illustrates an exemplary partial side view of a conventional flip-chip device 100. As shown in FIG. 1, a flip-chip device 100 includes a package substrate 110 having a plurality of insulating (171 and 172) and metal layers (161, 162 and 163). The various metal layers 161, 162 and 163 can be interconnected using vias, such as via 116. On a backside of the substrate a ball grid array (BGA) 130 can be used to connect to the flip-chip device 100 (formed of die 120 (also referred to herein as "chip" and package substrate 110) to external devices, circuitry, etc. On the front side of the package substrate 110 is a bond pad 114, illustrated as a copper bond pad 114. A solder resist layer 112 is formed over the bond pad 114. The solder resist layer 112 can be a photosensitive polymer material having a narrow opening to allow for connection to the bond pad 114. A solder-on-pad (SOP) 115 is provided to fill the opening to facilitate connection to the bond pad 114 in later operations. The SOP 115 can be formed by a solder drop or can be printed with a solder paste and reflow process to fill the opening. As discussed above, the SOP is used to prevent voids in the interconnection of the package substrate 110 to the die 120. The under bump metallization (UBM) 122 of the die 120 is used for connecting the die 120 to the package substrate 110 with solder bump 125 for flip-chip packages. The UBM 122 of the die 120 may be formed of aluminum or copper. A detailed image 150 illustrates a cross-section the interconnection after the die 120 is attached to the package substrate 110. The solder joint 135 forms the electrical connection between the UBM 122 and bond pad 114 through the opening in the solder resist layer 112, which provides the electrical connection between die 120 and package substrate 110 for the flip-chip device 100. It will be appreciated that although only one interconnection between the die 120 and package substrate 110 is illustrated, a plurality of interconnections are used for the flip-chip device 100.

Figure 2:
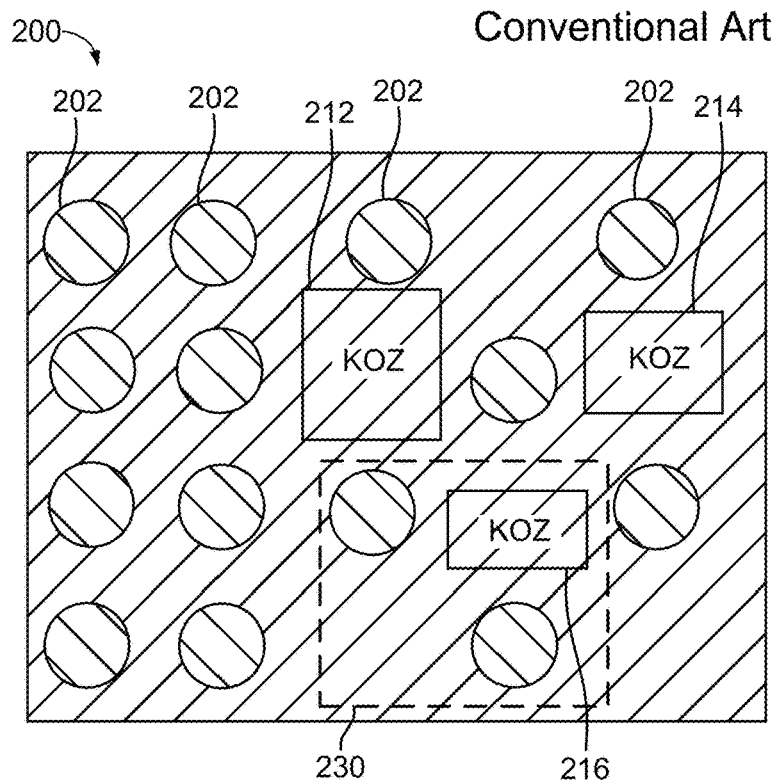
FIG. 2 illustrates a partial image of a conventional UBM design for a RF die based on conventional design rules.

FIG. 2 illustrates a partial image of a conventional UBM design for a RF die 200 based on conventional design rules. As discussed above, current flip-chip designs either use uniform bump size across the whole chip or define the different bump size according to die location (e.g., perimeter vs. core). To allow for the RF die 200 design considerations (e.g., inductor location, power amplifiers, etc.) many portions of the RF die 200 connection surface will be designated as a design KOZ (e.g., KOZ 212, KOZ 214 and KOZ 216). It will be appreciated that a KOZ is used to exclude bump placement in an excluded area to avoid interference from bump. The excluded area could be due to an inductor, static random access memory (SRAM), or other electrical/mechanical sensitive design. A plurality of under bump metallizations 202 (UBMs) have a general uniform size and spacing. The UBMs 202 may not be located in KOZ 212, KOZ 214 or KOZ 216, which reduces the UBM density and creates design difficulties when trying to accommodate for the various connections to the RF die 200. It will be appreciated that local areas adjacent the KOZ 212, KOZ 214 and KOZ 216 have very low UBM 202 density due to the large keep-out-zones on the RF die 200. For example, local area 230 has only two UBMs 202. Low UBM density can cause mechanical stress concern during chip attachment and ultimately reduce the reliability of the RF die 200 when attached to a package in a flip-chip configuration.

Figure 3A:
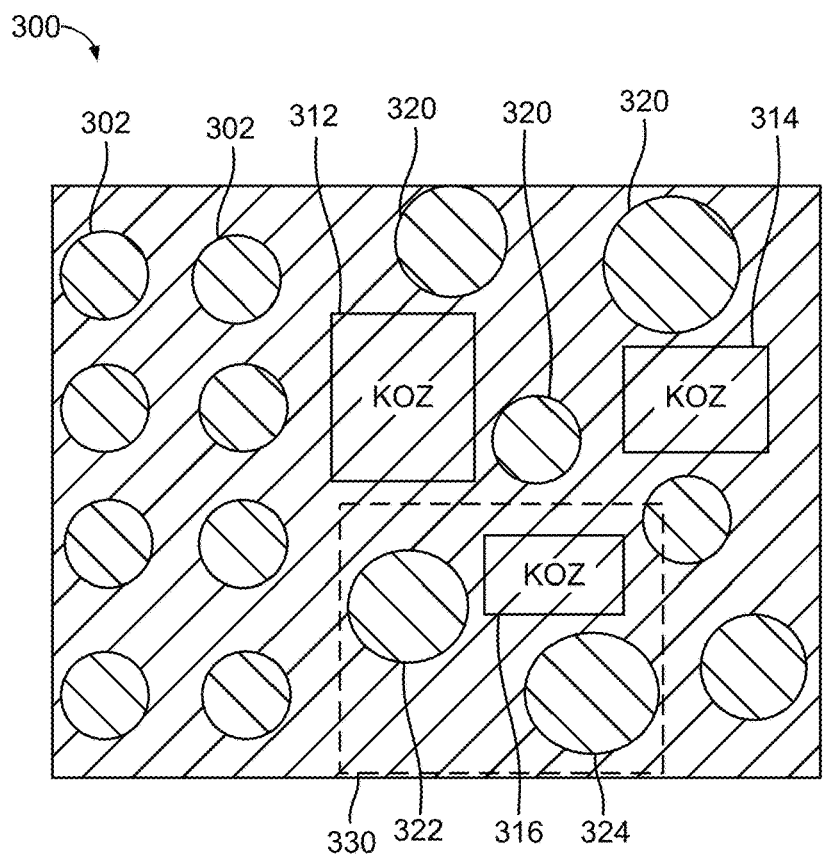
FIG. 3A illustrates a partial image of a UBM design for a RF die based on design rules in accordance with some examples of the disclosure.

FIG. 3A illustrates a partial image of a UBM design for a RF die 300 based on design rules according to various aspects of the disclosure. As discussed above, to allow for the various RF die 300 design considerations (e.g., inductor location, power amplifiers, etc.) many portions of the RF die 300 connection surface will be designated as a design KOZ (e.g., KOZ 312, KOZ 314 and KOZ 316). A plurality of under bump metallizations 302 (UBMs) may have a general uniform size and spacing. However, unlike the conventional designs, the various aspects disclosed may use various UBMs 320 may have various UBM sizes, as illustrated, depending on the bump-to-bump pitch design rules. Although the UBMs 320 are still not located in KOZ 312, KOZ 314 or KOZ 316, the flexible size, location and spacing of the UBMs 320 allow to improve the overall UBM density and facilitates design flexibility to accommodate for the various connections to the RF die 300. It will be appreciated, for example, that a local area 330 to adjacent KOZ 316 may include UBM 322 and UBM 324 (included in the plurality of UBMs 320), which are much larger than UBMs 302 and are spaced at a different pitch. Accordingly, the UBM density (surface area of the combined UBMs 322 and 324) in the local area 330 is increased over conventional design (e.g., as compared to local area 230 of FIG. 2). It will be appreciated that the flexible UBM design rules according to the various aspects disclosed allow for variations in UBM size, location, and/or pitch to provide for greater design control. It will be appreciated that the aforementioned aspects are merely provided as examples and the various aspects claimed are not limited to the specific references and/or illustrations provided. For example, it will be appreciated that the number, location and/or size of the keep-out-zones and/or UBMs may be more or less than the illustrated aspects and that these illustrations are provided merely to aid in the explanation of the various aspects disclose herein.

Figure 3B:
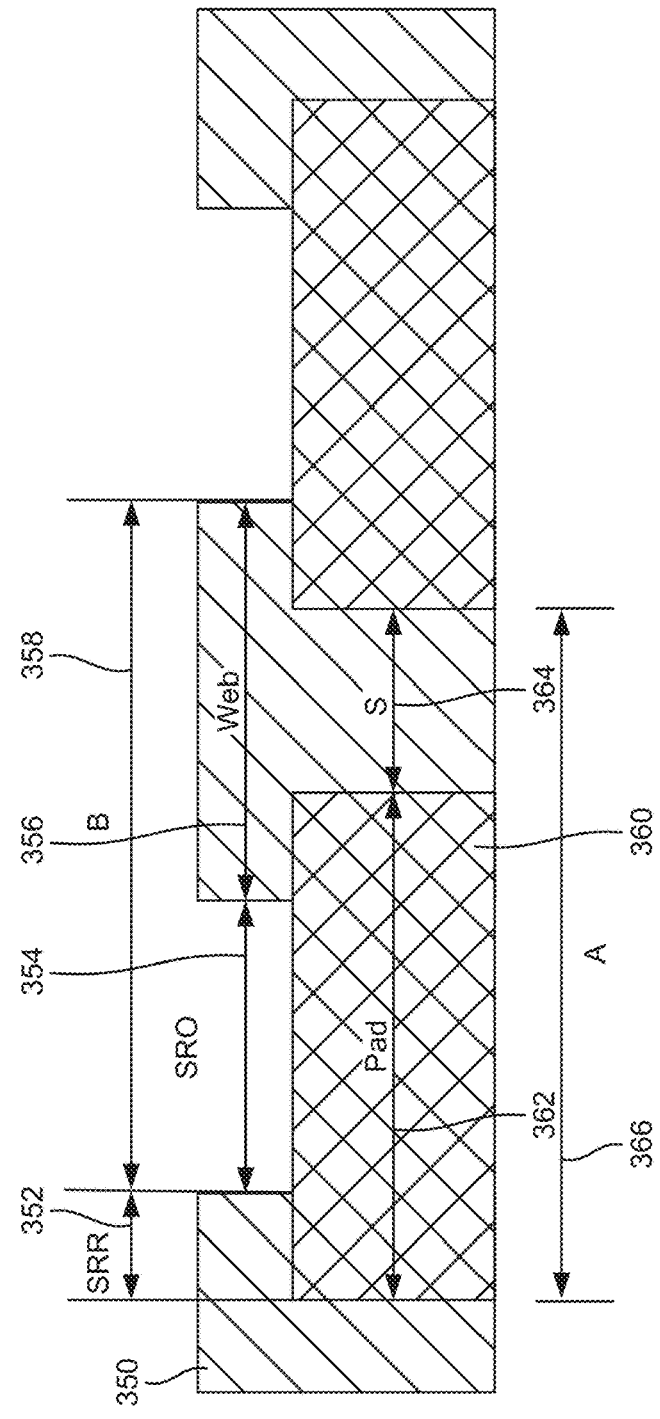
FIG. 3B illustrates details of UBM design considerations for design rules according to various aspects of the disclosure.

FIG. 3B illustrates details of UBM design considerations for design rules according to various aspects of the disclosure. In the illustration, a variety of measurements are illustrated. The solder resist registration (SRR) measurement 352 represents an overlay of the solder resist 350 over a bond pad 360. The solder resist opening (SRO) 354 is smaller than the bond pad 360 and allows access to the bond pad 360 through the solder resist 350. The Web measurement 356 of the solder resist is the spacing between SROs 354 for adjacent bond pads 360. A measurement B 358 is a distance of the SRO 354 plus the web 356. The bond pad 360 has a pad measurement 362 (e.g., diameter). A pad to pad measurement S 364 is a distance between adjacent pads 360 without intervening traces between the pads 360. The measurement A 366 is the sum of pad measurement 362 plus the pad to pad measurement (S) 364. These design features of a given substrate can be used to determine the pitch (e.g., the bump to bump pitch (with no trace between)) for a given design. For example, as illustrated in the associated table in FIG. 3B, design rules can be used to determine minimum UBM pitch for a given UBM size. For example, the minimum pitch may be determined as the minimum of measurement A 366 or measurement B 358, for a given design. In one example, the SRO 354 may be determined based on the size of the UBM (e.g., UBM size+25 µm). The Web measurement 356 may be determined based on a substrate design rule (e.g., Web is 40 µm for the given UBM sizes of 75 µm and 60 µm). The design measurement B is determined as the sum of the SRO and Web measurements. Likewise, design measurement A can be determined from the sum of the pad measurement 362 and pad to pad measurement S 364. The pad 360 can be defined as the sum of the SRO 354 and two times the SRR measurement 352. The SRR measurement 352 may be determined based on the substrate design rule (e.g., SRR is 12.5 µm for the given UBM sizes of 75 µm and 60 µm). Likewise, the pad to pad measurement S 364 may be determined based on the substrate design rule (e.g., S is 20 µm for the given UBM sizes of 75 µm and 60 µm). Accordingly, for the example design of FIG. 3B, the minimum UBM pitch is 145 µm for UBM size of 75 µm and the minimum UBM pitch is 130 µm for UBM size of 60 µm. Further, in a mixed UBM size configuration, in one example, with the UBM size mix from 60 µm to 75 µm results in a minimum pitch of (130 µm+145 µm)/2=137.5 µm between adjacent UBMs of different sizes.

Figure 4:
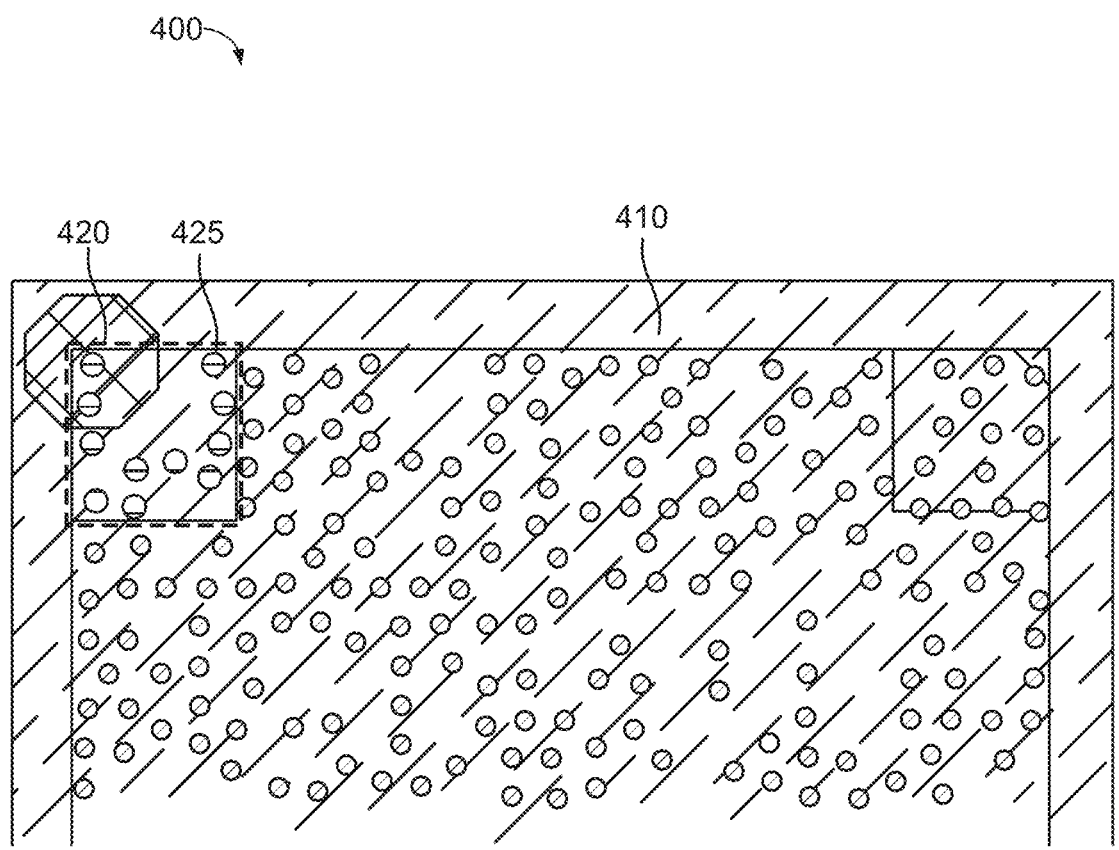
FIG. 4 illustrates a partial image of a UBM pattern on a die in accordance with some examples of the disclosure.

FIG. 4 illustrates a partial image of a UBM pattern on a die 400 in accordance with some examples of the disclosure. As shown in FIG. 4, a die 400 may have a UBM pattern 410 that in some examples is formed via a plating process. However, as illustrated an area 420 has a limited number of UBMs 425 within the area 420 due to a KOZ in the design. In this example, the original design had a uniform UBM size of 84 µm. Using aspects disclosed allowing for a flexible UBM sizing and design rules, the UBMs 425 in area 420 can be redesigned to increase the UBM size to 94 µm.

Accordingly, for the same number of UBMs 425, the UBM density in area 420 can be increased by about 12%. It will be appreciated that these examples are provided solely for illustration and the UBM increase may be greater or less than the examples discussed. Further it will be appreciated that real world design constraints, such as KOZs, minimum pitch spacing, number of UBMs needed, fabrication limitations, etc., all contribute to design complexities, which the flexible UBM size and design rules of the various aspects disclosed can help to address. Additionally, the increased UBM size provides a thermal benefit to the package substrate and flip-chip device.

Figure 5:
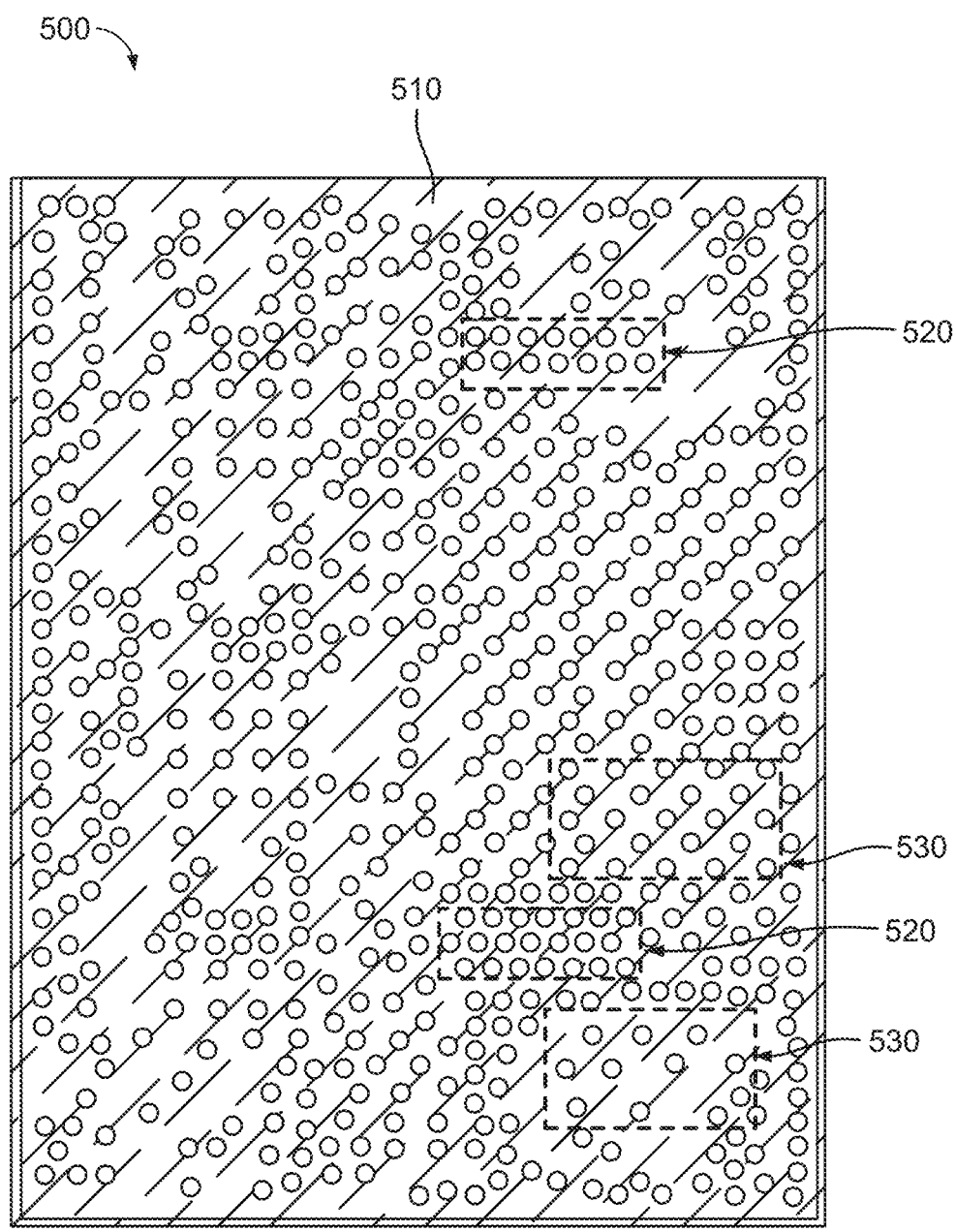
FIG. 5 illustrates another UBM pattern on a die in accordance with some examples of the disclosure.

FIG. 5 illustrates another UBM pattern on a die 500 in accordance with some examples of the disclosure. As shown in FIG. 5, a die 500 may have a UBM pattern 510 that in some examples is formed via a plating process. In this example, a first set of UBMs 520 have a UBM size of 60 µm with a minimum pitch 130 µm. A second set of UBMs 530 have a UBM size of 75 µm with a minimum pitch 140 µm. It will be appreciated from the illustrated example, that the actual pitch does not have to be the same for even the same UBM size, but it cannot be less than the minimum pitch of UBM size of 60 µm for fabrication and reliability reasons. Likewise, the actual pitch of the second set of UBMs 530 may have various spacing, but it cannot be less than the minimum pitch for a UBM size of 75 µm. Further, it will be appreciated that both the 60 um and 75 um UBM sizes can be used across the die 500 area and may be used in a non-uniform pattern (e.g., are not limited to only the core or periphery), which can facilitate board layout and routing around various KOZs. As noted above, one constrain for a design rule is to meet the minimum bump pitch in order to place the responding metal pad design in the substrate. For example, in a 60 um to 60 um UBM design, the minimum pitch may be 130 um and for a 75 µm to 75 µm UBM design, the minimum pitch may be 145 µm. Accordingly, in one example, the 60 µm to 75 µm UBM mixed design results in a minimum pitch of (130 µm+145 µm)/2=137.5 µm. It will be appreciated that the foregoing illustrated and discussed examples are provided merely for explanation and should not be construed as limitations of the various aspects disclosed and claimed herein. For example, the UBM sizes and minimum pitch spacing may vary according to the various circuit layout design considerations and limitations. Further, there may be more than just two UBM sizes used in a given design, along with a corresponding the substrate pad design change and bump minimum pitch defined.

Figure 6:
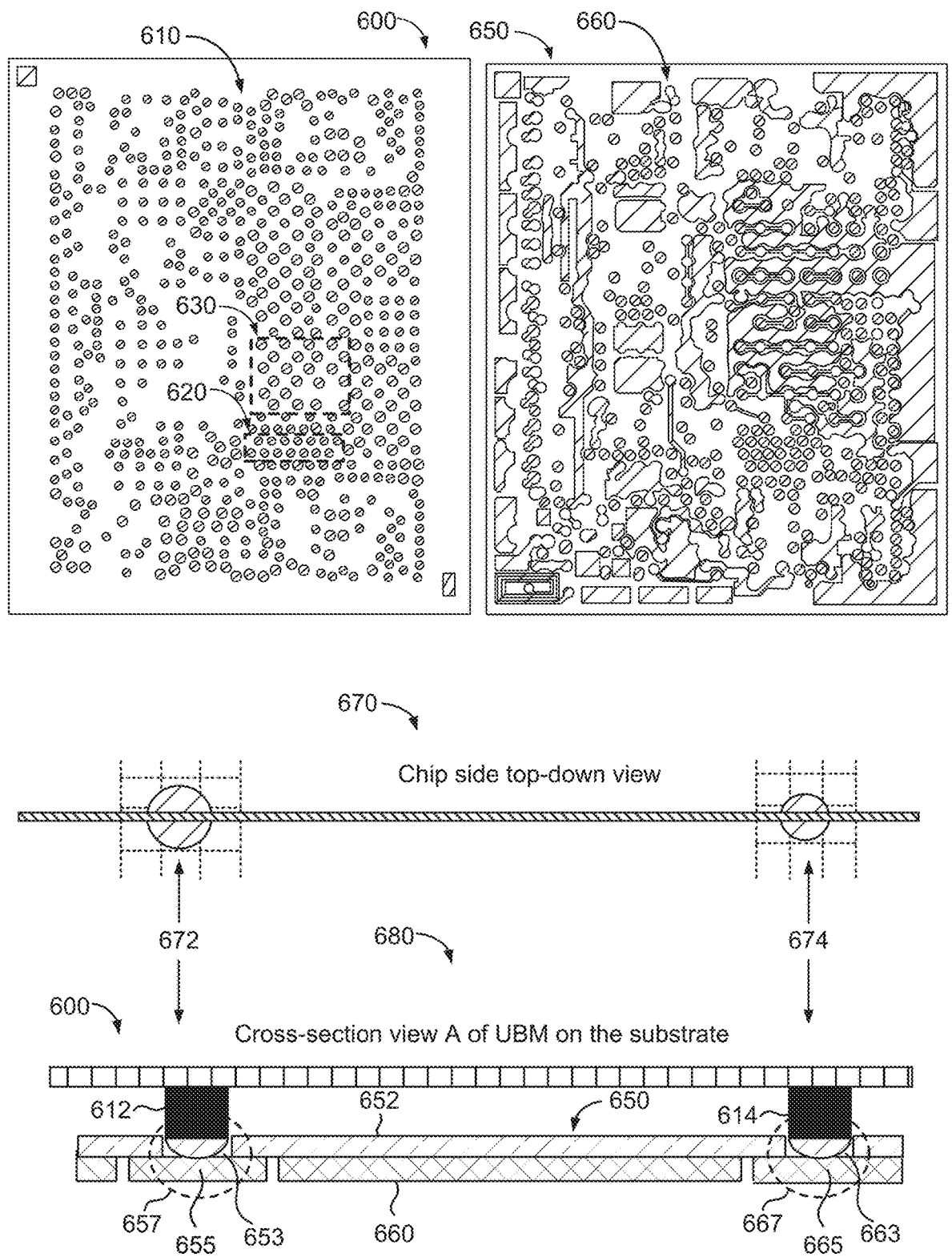
FIG. 6 illustrates top down view of a UBM pattern on a die and a first metal (M1) layer on a package substrate in accordance with some examples of the disclosure.

FIG. 6 illustrates a top down view of a UBM pattern 610 on a die 600 and top down view of a first metal (M1) layer 660 on a package substrate 650 in accordance with some examples of the disclosure. As shown in FIG. 6, a die 600 may have a UBM pattern 610, illustrated in a top down view, which in some examples is formed via a plating process. In this example, a first set of UBMs 620 have a UBM size and minimum pitch that is different than a second set of UBMs 630. In the illustrated example, UBMs 620 have a smaller UBM size and minimum pitch than UBMs 630. A package substrate 650 may have a M1 layer 660 that has been pattern to provide electrical coupling to the UBMs. The M1 layer 660 is the fusion of all metal drawings in that layer in the design, including each bond pad (e.g., 655 and 665) which in some aspects is 1:1 ratio to UBM (e.g., 612 and 614, respectively), and other lines, pads, etc. for electrical distribution. The metal drawing pattern of M1 layer 660 is covered by the solder resist 652 and the bond pads 655 and 665 are exposed by solder resist opening (SROs) in the solder resist 652, e.g., SRO 653 and SRO 663, on the top of M1 layer 660 pattern. Each opening size (e.g., SROs 653 and 663) corresponds to the UBM size for each UBM (e.g., UBM 612 and UBM 614, which may be different) and the M1 layer 660 pattern bond pads (e.g., 655 and 665), which are sized to meet a minimum SRR between the SRO and bond pad edge, as discussed above.

A die side (or chip side) top down view 670 is provided illustrating two connection points 672 and 674. Additionally, a cross-section view 680 is provided illustrating the two connection points 672 and 674. The UBMs 612 and 614 of die 600 (which may be any of the UBMs illustrated) are coupled to the M1 layer 660 of package substrate 650, at connection points 672 and 674, respectively. A solder resist 652 is also provided on package substrate 650 having openings to allow for the connection to the M1 layer 660. However, unlike conventional flip chip designs, the various aspects disclosed herein provide that the package substrate 650 design is all bond-on-pad design for each of the different UBM sizes. For example, the bond-on-pad connections 657 and 667 are formed by connecting the UBM 612 and UBM 614 to the bond pads 655 and 665 through the SROs 653 and 663, respectively.

Figure 7:
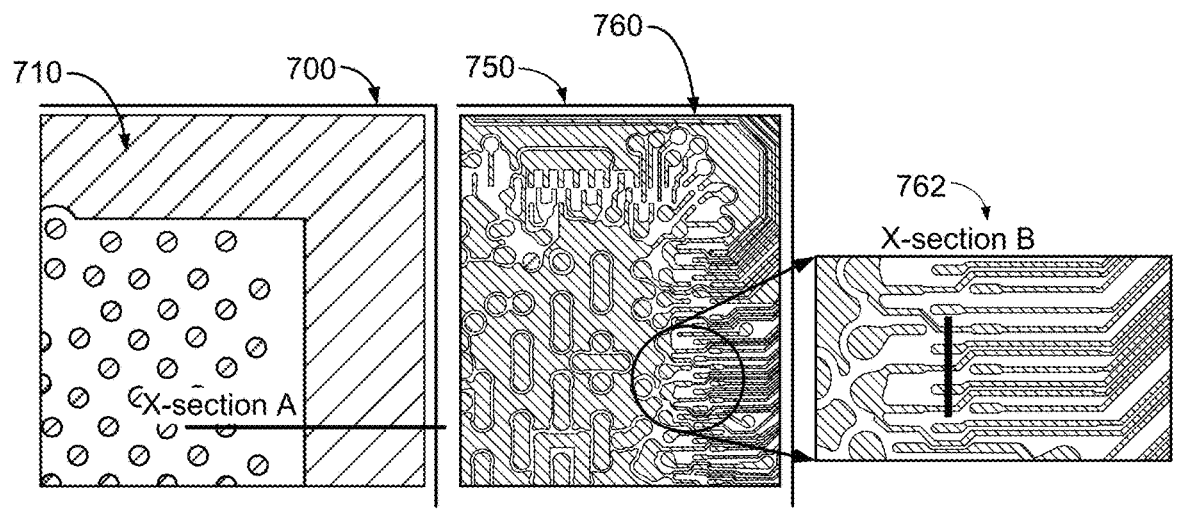
FIG. 7 illustrates partial top down view of a UBM pattern on a die and a first metal (M1) layer on a package substrate in accordance with conventional designs.
Figure 7:
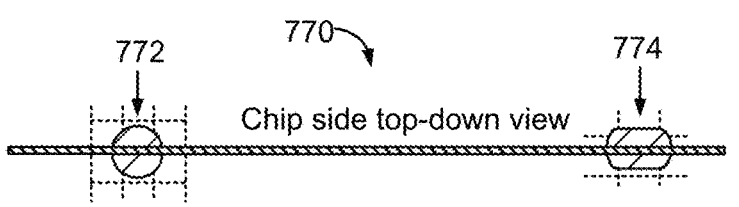
Figure 7:
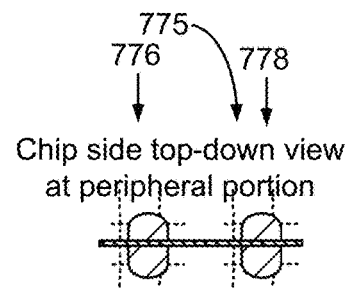
Figure 7:
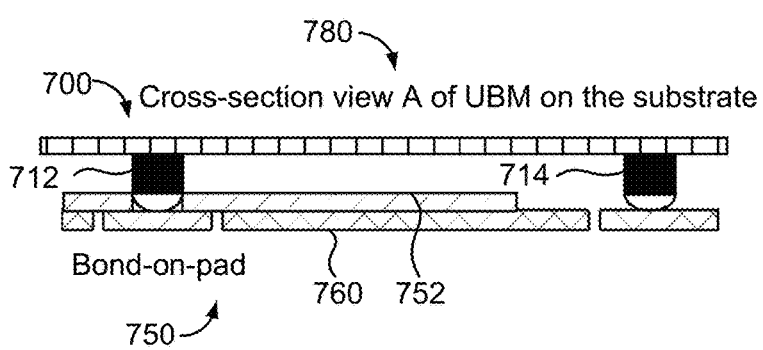
Figure 7:
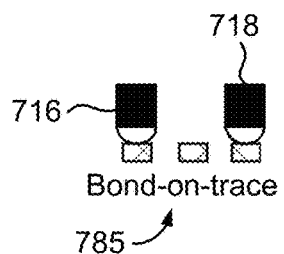

FIG. 7 illustrates a partial top down view of a UBM pattern 710 on a die 700 and top down view of a first metal (M1) layer 760 on a package substrate 750 in accordance with conventional designs. As shown in FIG. 7, a die 700 may have a UBM pattern 710, illustrated in a top down view. In the conventional design there is one UBM size and minimum pitch. A package substrate 750 may a have an M1 layer 760 that has pattern to provide electrical coupling to the UBMs. An expanded view of cross-section B is illustrated in 762. A die side (or chip side) top down view 770 is provided illustrating two connection points 772 and 774. Additionally, a cross-section view 780 is provided illustrating the two connection points 772 and 774, via UBMs 712 and 714, respectively. The UBMs 712 and 714 of die 700 (which may be any of the UBMs illustrated) are coupled to the M1 layer 760 of package substrate 750, at connection points 772 and 774, respectively. A solder resist 752 is also provided on package substrate 750 having openings to allow for the connection to the M1 layer 760, for the bond-on-pad connection of UBM 712 and bond-on-trace connection of UBM 714. A die side (or chip side) top down view 775 is also provided illustrating two connection points 776 and 778 at a peripheral portion. Additionally, a cross-section view 785 is provided illustrating the two connection points 776 and 778, via UBMs 716 and 718, respectively. The UBMs 716 and 718 of die 700 (which may be any of the UBMs illustrated) are coupled to the M1 layer 760 of package substrate 750, via bond-on-trace connections at connection points 776 and 778, respectively. It will be appreciated that conventional flip chip designs do not use an all bond-on-pad connection for all UBMs.

In order to fully illustrate aspects of the present disclosure, methods of fabrication are presented. Other methods of fabrication are possible, and discussed fabrication methods are presented only to aid understanding of the concepts disclosed herein.

Figure 8A:
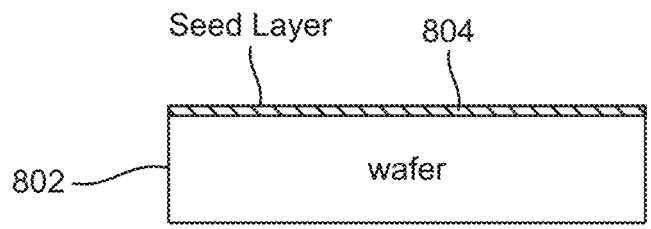
FIGS. 8A and 8B illustrate fabrication techniques in accordance with one or more aspects of the disclosure.
Figure 8A:
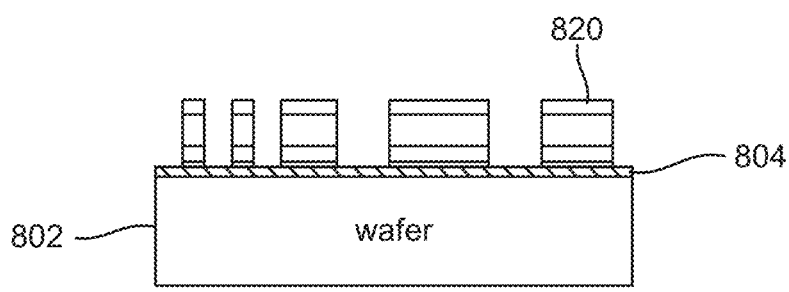
Figure 8A:
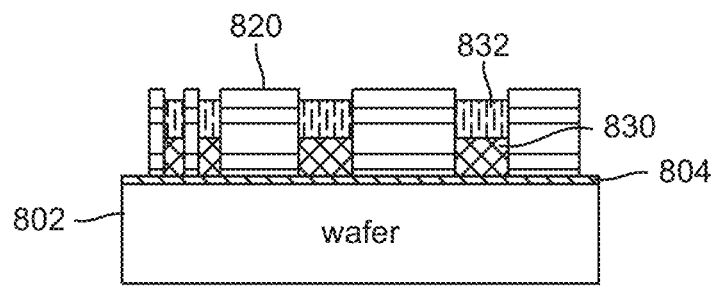
Figure 8B:
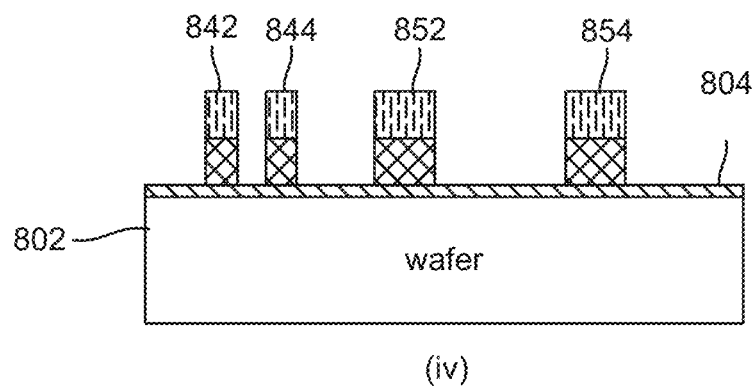
Figure 8B:
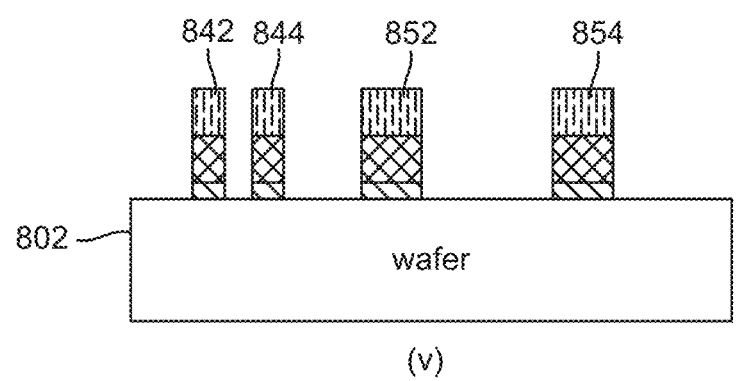
Figure 8B:
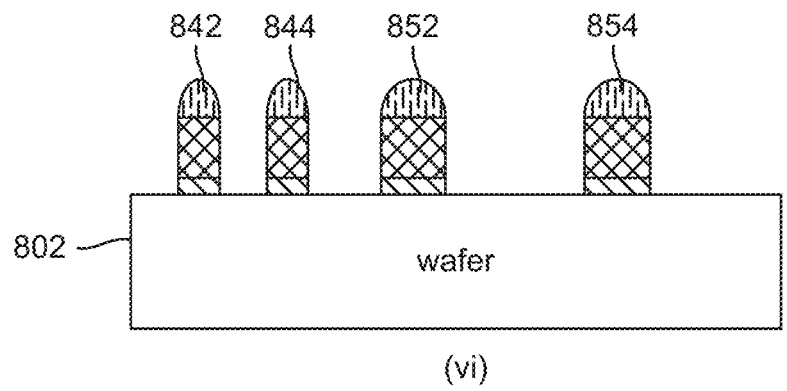

FIGS. 8A and 8B illustrate fabrication techniques in accordance with one or more aspects of the disclosure. Referring to FIG. 8A, in process portion (i) a wafer 802 is provided and a metal seed layer 804 is deposited. It will be appreciated that the wafer may contain multiple dies prior to dicing. Alternatively the process can apply to an individual die. The metal seed layer 804 may be copper or any other suitable material. In process portion (ii) the wafer 802 with the metal seed layer 804 is coated with a photoresist and a photolithography process is applied to form the patterned photoresist material 820. In process portion (iii) the wafer 802 with the metal seed layer 804 and patterned photoresist material 820 is plated with one or more conductive materials that fill openings in the patterned photoresist material 820. In some example aspects, a first conductive material 830 may be copper and a second conductive material 832 may be a tin-silver (SnAg) solder. In some example aspects, the first conductive material 832 and second conductive material 832 may be applied by electroplating.

Referring to FIG. 8B, in process portion (iv) the wafer 802 with the metal seed layer 804 has the patterned photoresist material 820 stripped away which exposes the one or more conductive materials. Specifically, as illustrated, the first conductive material 830 and second conductive material 832 are exposed along with the metal seed layer 804. The patterned photoresist material 820 may be stripped away using a chemical solution or any suitable stripping method. In process portion (v) the wafer 802 has the metal seed layer 804 stripped away. The metal seed layer 804 may be stripped away using a chemical etching or any suitable stripping method. Removing the exposed seed layer forms the UBM pillars 842, 844, 852 and 854. As discussed in the foregoing, it will be appreciated that UBM pillars 842 and 844 have a different size (i.e., diameter) and minimum pitch spacing compared to UBM pillars 852 and 854. In process portion (vi) the wafer 802 with the UBM pillars 842, 844, 852 and 854 goes through a reflow process which forms the bumps on the UBM pillars 842, 844, 852 and 854. It will be appreciated that the foregoing fabrication process was provided merely as a general illustration of some of the aspects of the disclosure and is not intended to limit the disclosure or accompanying claims. For example, the plating chemistry can be varied to form different bump types. Additionally, Cu pillars 842, 844, 852, 854 may have a different metal stack. In some aspects, the illustrated Cu/SnAg configuration may be modified to include nickel (Ni) between of Cu and SnAg, or any other suitable metal combination. Further, in some aspects, he Cu pillars 842, 844, 852, 854 may be replaced by SnAg bumps. Additionally, in some aspects, the UBM can be a Cu pillar or SnAg bump. Further, many details in the fabrication process have been skipped or combined in summary process portions to facilitate an understanding of the various aspects disclosed without a detailed rendition of each detail and/or all possible process variations.

Figure 9:
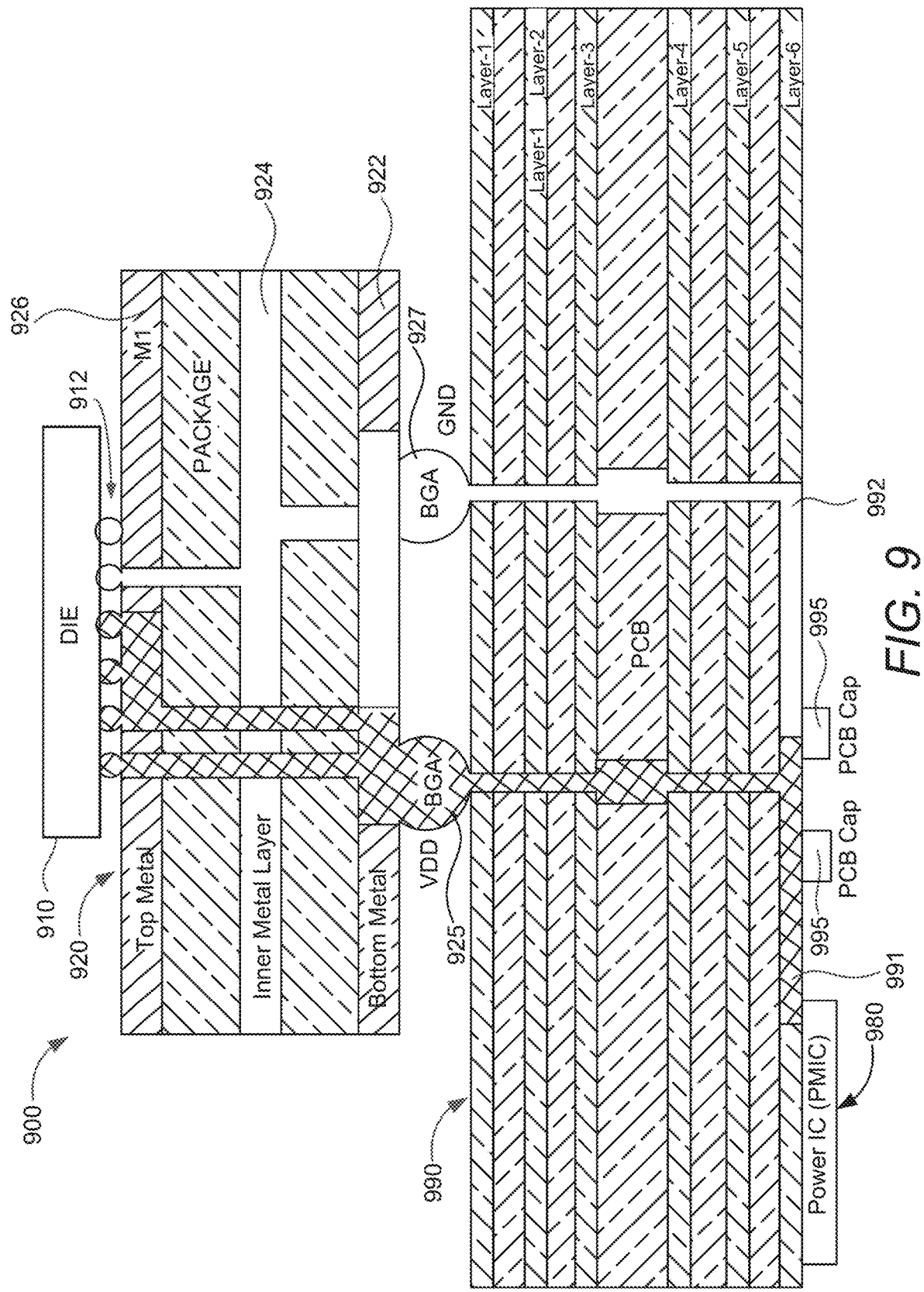
FIG. 9 illustrates components of an integrated device according to one or more aspects of the disclosure.

FIG. 9 illustrates components of an integrated device 900 according to one or more aspects of the disclosure. Regardless of the various configurations of the flip-chip packages (e.g., die 910 and package 920) discussed above, it will be appreciated that the package 920 may be configured to couple the die 910 to a PCB 990. The package 920 may include one or more metal layers. In FIG. 9, the package 920 is illustrated as including three metal layers—bottom metal layer 922, an inner metal layer 924, and a top metal layer 926. The PCB 990 is also coupled to a power supply 980 (e.g., a power management integrated circuit (PMIC)), which allows the package 920 and the die 910 to be electrically coupled to the PMIC 980. Specifically, one or more power supply (VDD) lines 991 and one or more ground (GND) lines 992 may be coupled to the PMIC 980 to distribute power to the PCB 990, package 920 via VDD BGA pin 925 and GND BGA pin 927 and to the die 910 via die bumps 912 (which may be plated UBMs of various sizes and pitches, coupled to the top metal layer/M1 layer 926 of package 920, as discussed above). The VDD line 991 and GND line 992 each may be formed from traces, shapes or patterns in one or more metal layers of the PCB 990 (e.g., layers 1-6) coupled by one or more vias through insulating layers separating the metal layers 1-6 in the PCB 990. The PCB 990 may have one or more PCB capacitors (PCB cap) 995 that can be used to condition the power supply signals, as is known to those skilled in the art. Additional connections and devices may be coupled to and/or pass through the PCB 990 to the package 920 via one or more additional BGA pins (not illustrated) on the package 920. It will be appreciated that the illustrated configuration and descriptions are provided merely to aid in the explanation of the various aspects disclosed herein. For example, the PCB 990 may have more or less metal and insulating layers, there may be multiple lines providing power to the various components, etc. Accordingly, the forgoing illustrative examples and associated figures should not be construed to limit the various aspects disclosed and claimed herein.

In accordance with the various aspects disclosed herein, at least one aspect includes a flip-chip including: a die (e.g., 300, 400, 500, 600 and 910) having a plurality of under bump metallizations (UBMs, e.g., 302, 320, 425, 520, 530, 620, 630, etc.) and a package substrate (e.g., 650 and 920) having a plurality of bond pads. The plurality of UBMs include a first set of UBMs (e.g., 520 and 620) having a first size and a first minimum pitch and a second set of UBMs (e.g., 530 and 630) having a second size and a second minimum pitch. The first set of UBMs and the second set of UBMs are each electrically coupled to the package substrate by a bond-on-pad connection (e.g., 655). Among the various technical advantages the various aspects disclosed provide, in at least some aspects, provide for a mixed die UBM size and associate package bond pad design which can facilitate die and package design (e.g., accommodating layout of designs with large KOZ), improve UBM/pad density and thermal characteristics of the flip-chip, which are not available in conventional designs.

Further aspects may include one or more of the following features. The flip-chip device where the plurality of bond pads are formed in a first metal layer of the package substrate. The flip-chip device where the package substrate is covered by a solder resist with openings over the plurality of bond pads. The flip-chip device where the first size and the first minimum pitch of the first set of UBMs are generally uniform and smaller than the second size and the second minimum pitch of the second set of UBMs. The flip-chip device where the first set of UBMs each has a size of approximately 65 µm and a minimum pitch 130 µm and the second set of UBMs each has a size of approximately 75 µm and a minimum pitch 140 µm. The flip-chip device where the first set of UBMs each has a size of approximately 84 m and the second set of UBMs each has a size of approximately 94 µm. The flip-chip device where the first set of UBMs and the second set of UBMs are distributed across a surface of the die in a non-uniform pattern. The flip-chip device where the plurality of UBMs each have a generally cylindrical, columnar or pillar shape. The flip-chip device where the plurality of UBMs are each formed of copper (Cu) pillar with bump formed of tin-silver (SnAg) solder. The flip-chip device where the flip-chip device is incorporated into an apparatus selected from the group including of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Figure 10:
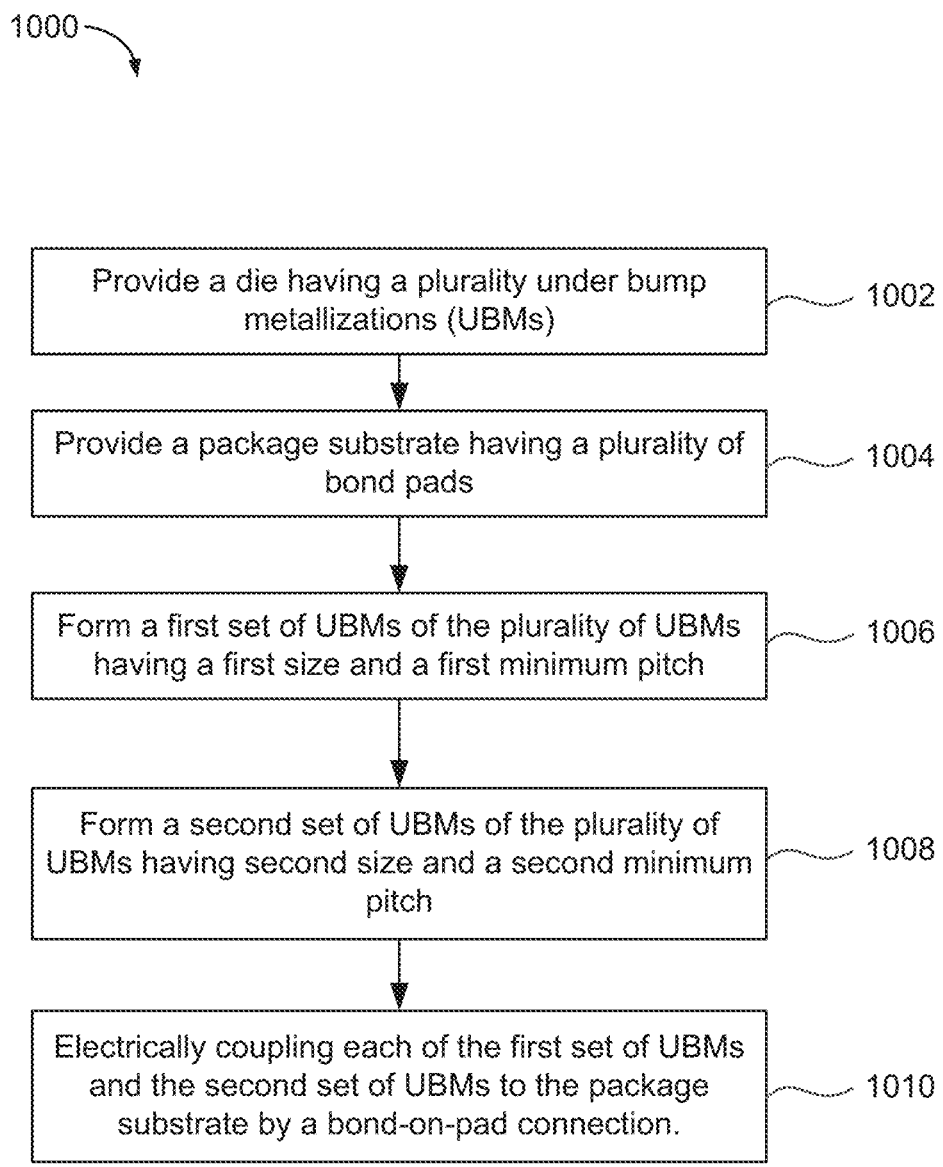
FIG. 10 illustrates a flowchart of a method for manufacturing a flip-chip device in accordance with some examples of the disclosure.

It will be appreciated from the foregoing that there are various methods for fabricating devices as disclosed herein. FIG. 10 illustrates a flowchart of a method 1000 for fabricating a flip-chip device (e.g., any die and package substrate configuration detailed in the foregoing) in accordance with some examples of the disclosure. As shown in FIG. 10, the partial method 1000 may begin in block 1002 with providing a die having a plurality of under bump metallizations (UBMs). The partial method 1000 may continue in block 1004 with providing a package substrate having a plurality of bond pads. The partial method 1000 continues in block 1006 with forming a first set of UBMs of the plurality of UBMs having a first size and a first minimum pitch. The partial method 1000 continues in block 1008 with forming a second set of UBMs of the plurality of UBMs having second size and a second minimum pitch. The partial method 1000 continues in block 1010 with electrically coupling each of the first set of UBMs and the second set of UBMs to the package substrate by a bond-on-pad connection. As discussed in the foregoing, the various sized UBMs can be formed using a process similar to that illustrated in relation to FIG. 8A and FIG. 8B. According to various aspects disclosed, dies and/or package substrates can be formed using the new design rules discussed herein. Accordingly, it will be appreciated from the foregoing disclosure that additional processes for fabricating the various aspects disclosed herein will be apparent to those skilled in the art and a literal rendition of the processes discussed above will not be provided or illustrated in the included drawings.

Figure 11:
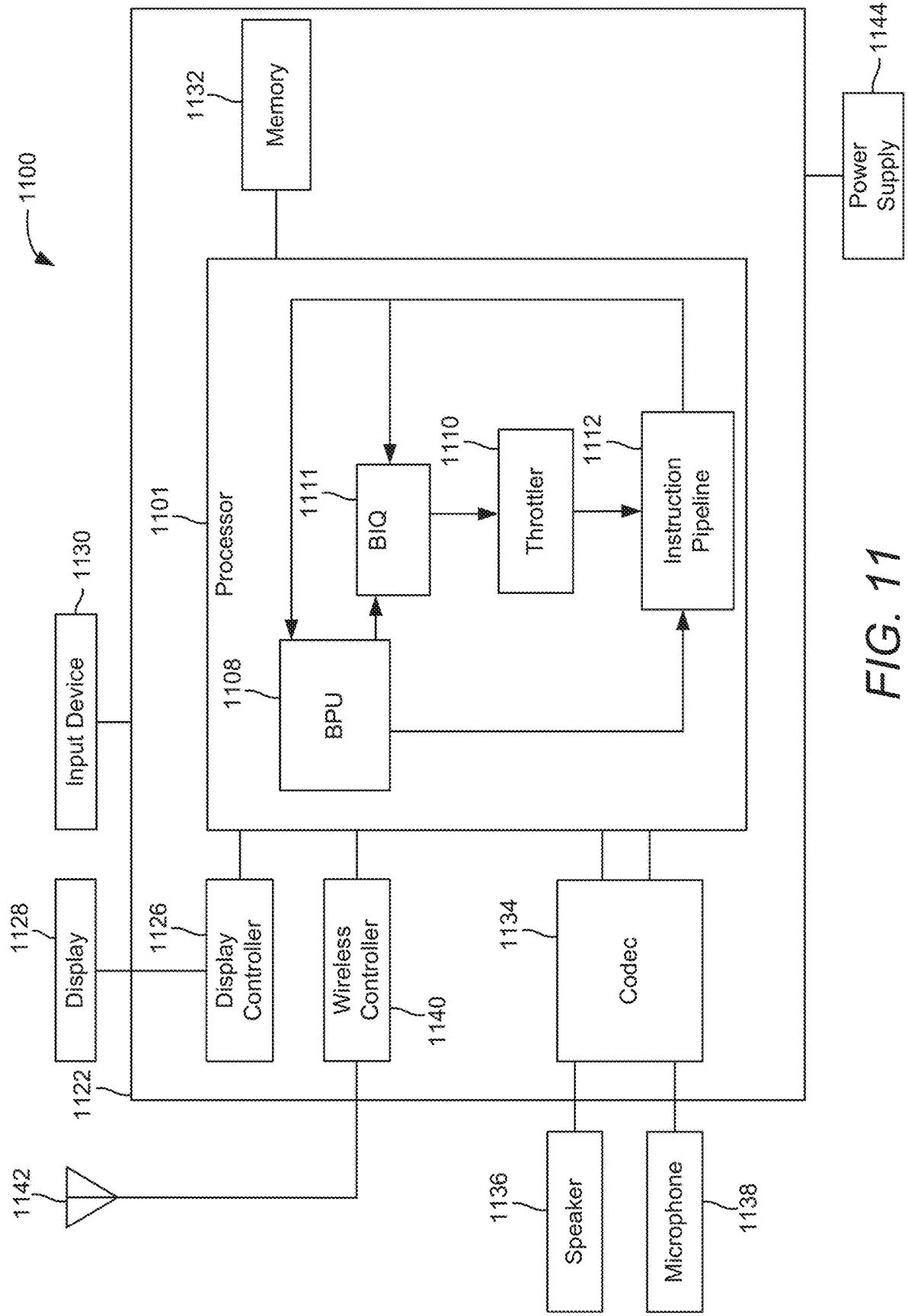
FIG. 11 illustrates an exemplary mobile device in accordance with some examples of the disclosure

FIG. 11 illustrates an exemplary mobile device in accordance with some examples of the disclosure. Referring now to FIG. 11, a block diagram of a mobile device that is configured according to exemplary aspects is depicted and generally designated mobile device 1100. In some aspects, mobile device 1100 may be configured as a wireless communication device. As shown, mobile device 1100 includes processor 1101. Processor 1101 is shown to comprise instruction pipeline 1112, buffer processing unit (BPU) 1108, branch instruction queue (BIQ) 1111, and throttler 1110 as is well known in the art. Other well-known details (e.g., counters, entries, confidence fields, weighted sum, comparator, etc.) of these blocks have been omitted from this view of processor 1101 for the sake of clarity. Processor 1101 may be communicatively coupled to memory 1132 over a link, which may be a die-to-die or chip-to-chip link. Mobile device 1100 also includes display 1128 and display controller 1126, with display controller 1126 coupled to processor 1101 and to display 1128.

In some aspects, FIG. 11 may include coder/decoder (CODEC) 1134 (e.g., an audio and/or voice CODEC) coupled to processor 1101; speaker 1136 and microphone 1138 coupled to CODEC 1134; and wireless circuits 1140 (which may include a modem, RF circuitry, filters, etc., which may be implemented using one or more flip-chip devices, as disclosed herein) coupled to wireless antenna 1142 and to processor 1101.

In a particular aspect, where one or more of the above-mentioned blocks are present, processor 1101, display controller 1126, memory 1132, CODEC 1134, and wireless circuits 1140 can be included in a system-in-package or system-on-chip device 1122 which may be implemented in whole or part using the flip-chip techniques disclosed herein. Input device 1130 (e.g., physical or virtual keyboard), power supply 1144 (e.g., battery), display 1128, input device 1130, speaker 1136, microphone 1138, wireless antenna 1142, and power supply 1144 may be external to system-on-chip device 1122 and may be coupled to a component of system-on-chip device 1122, such as an interface or a controller.

It should be noted that although FIG. 11 depicts a mobile device, processor 1101, memory 1132 and other components may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 12:
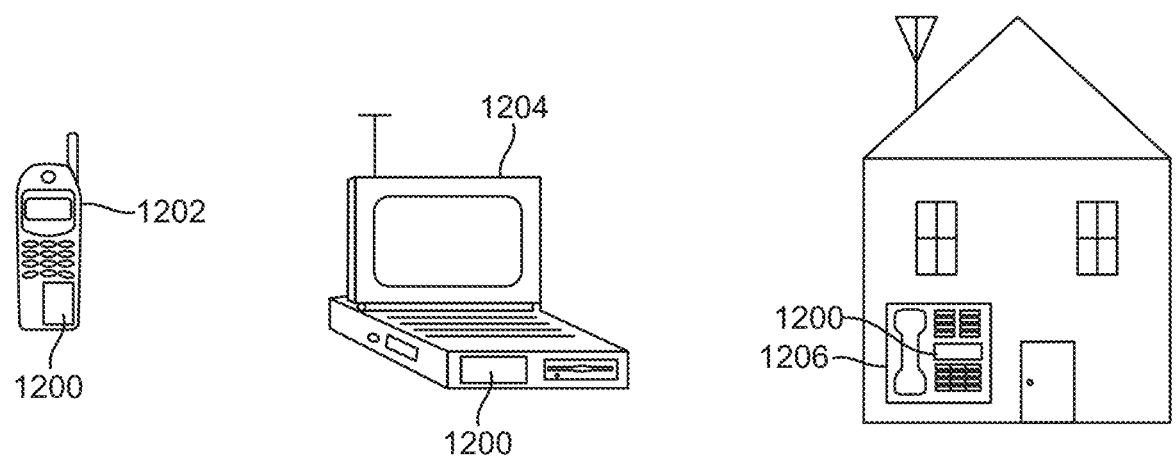
FIG. 12 illustrates various electronic devices that may be integrated with any of the aforementioned integrated device or semiconductor device accordance with various examples of the disclosure.

FIG. 12 illustrates various electronic devices that may be integrated with any of the aforementioned integrated device or semiconductor device accordance with various examples of the disclosure. For example, a mobile phone device 1202, a laptop computer device 1204, and a fixed location terminal device 1206 may each be consider generally user equipment (UE) and may include a flip-chip device 1200 as described herein. The flip-chip device 1200 may be, for example, any of the integrated circuits, dies, integrated devices, integrated device packages, integrated circuit devices, device packages, integrated circuit (IC) packages, package-on-package devices described herein. The devices 1202, 1204, 1206 illustrated in FIG. 12 are merely exemplary. Other electronic devices may also feature the flip-chip device 1200 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into a flip-chip package. The flip-chip packages may then be employed in devices described herein.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1-12 may be rearranged and/or combined into a single component, process, feature or function or incorporated in several components, processes, or functions. Additional elements, components, processes, and/or functions may also be added without departing from the disclosure. It should also be noted that FIGS. 1-12 and corresponding description in the present disclosure are not limited to dies and/or ICs. In some implementations, FIGS. 1-12 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A flip-chip device comprising:
   a die having a plurality of under bump metallizations (UBMs); and
   a package substrate having a plurality of bond pads;
   wherein the plurality of UBMs include a first set of UBMs having a first size and a first minimum pitch and a second set of UBMs having a second size and a second minimum pitch, the first size being smaller than the second size;
   wherein the first set of UBMs and the second set of UBMs are each electrically coupled to the package substrate by a bond-on-pad connection, and
   wherein at least one UBM of the second set of UBMs is further from a periphery of the die than at least one UBM of the first set of UBMs.

2. The flip-chip device of claim 1, wherein the plurality of bond pads are formed in a first metal layer of the package substrate.

3. The flip-chip device of claim 2, wherein the package substrate is covered by a solder resist with solder resist openings over the plurality of bond pads.

4. The flip-chip device of claim 3, wherein the plurality of bond pads further comprise:
   a first set of bond pads configured to match the first size of the first set of UBMs; and
   a second set of bond pads configured to match the second size of the second set of UBMs.

5. The flip-chip device of claim 4, wherein the solder resist openings further comprise:

a first set of solder resist openings sized to match the first set of bond pads; and a second set of solder resist openings sized to match the first set of bond pads.

6. The flip-chip device of claim 1, wherein the first size and the first minimum pitch of the first set of UBMs are generally uniform and smaller than the second size and the second minimum pitch of the second set of UBMs.

7. The flip-chip device of claim 6, wherein the first set of UBMs each has a size of approximately 60 µm and a minimum pitch 130 µm and the second set of UBMs each has a size of approximately 75 µm and a minimum pitch 140 µm.

8. The flip-chip device of claim 6, wherein the first set of UBMs each has a size of approximately 84 µm and the second set of UBMs each has a size of approximately 94 µm.

9. The flip-chip device of claim 1, wherein the first set of UBMs and the second set of UBMs are distributed across a surface of the die in a non-uniform pattern.

10. The flip-chip device of claim 1, wherein the plurality of UBMs each have a generally cylindrical, columnar or pillar shape.

11. The flip-chip device of claim 10, wherein the plurality of UBMs are each formed of copper (Cu) pillar with bump formed of tin-silver (SnAg) solder.

12. The flip-chip device of claim 1, wherein a UBM immediately adjacent to a keep-out-zone (KOZ) is larger than a UBM further away from the KOZ, the KOZ defining an area where no UBM is located therein.

13. A method for fabricating a flip-chip device, the method comprising:

providing a die having a plurality of under bump metallizations (UBMs);

providing a package substrate having a plurality of bond pads; and forming a first set of UBMs of the plurality of UBMs having a first size and a first minimum pitch;

forming a second set of UBMs of the plurality of UBMs having second size and a second minimum pitch, the first size being smaller than the second size; and electrically coupling each of the first set of UBMs and the second set of UBMs to the package substrate by a bond-on-pad connection, wherein at least one UBM of the second set of UBMs is further from a periphery of the die than at least one UBM of the first set of UBMs.

14. The method of claim 13, wherein the plurality of bond pads are formed in a first metal layer of the package substrate.

15. The method of claim 14, wherein the package substrate is covered by a solder resist with solder resist openings over the plurality of bond pads.

16. The method of claim 15, wherein the plurality of bond pads further comprise:

a first set of bond pads configured to match the first size of the first set of UBMs; and a second set of bond pads configured to match the second size of the second set of UBMs.

17. The method of claim 16, wherein the solder resist openings further comprise:

a first set of solder resist openings sized to match the first set of bond pads; and a second set of solder resist openings sized to match the first set of bond pads.

18. The method of claim 13, wherein the first size and the first minimum pitch of the first set of UBMs are generally uniform and smaller than the second size and the second minimum pitch of the second set of UBMs.

19. The method of claim 18, wherein the first set of UBMs each has a size of approximately 60 µm and a minimum pitch 130 µm and the second set of UBMs each has a size of approximately 75 µm and a minimum pitch 140 µm.

20. The method of claim 18, wherein the first set of UBMs each has a size of approximately 84 µm and the second set of UBMs each has a size of approximately 94 µm.

21. The method of claim 13, wherein the first set of UBMs and the second set of UBMs are distributed across a surface of the die in a non-uniform pattern.

22. The method of claim 13, wherein the plurality of UBMs each have a generally cylindrical, columnar or pillar shape.

23. The method of claim 22, wherein the plurality of UBMs are each formed of copper (Cu) pillar with bump formed of tin-silver (SnAg) solder.

24. The method of claim 13, wherein a UBM immediately adjacent to a keep-out-zone (KOZ) is larger than a UBM further away from the KOZ, the KOZ defining an area where no UBM is located therein.

* * * * *